United States Patent
Tzartzanis et al.

(10) Patent No.: US 7,405,593 B2
(45) Date of Patent: Jul. 29, 2008

(54) SYSTEMS AND METHODS FOR TRANSMITTING SIGNALS ACROSS INTEGRATED CIRCUIT CHIPS

(75) Inventors: Nestor Tzartzanis, Belmont, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 79 days.

(21) Appl. No.: 11/265,550

(22) Filed: Nov. 1, 2005

(65) Prior Publication Data

US 2007/0103199 A1    May 10, 2007

Related U.S. Application Data

(60) Provisional application No. 60/731,195, filed on Oct. 28, 2005.

(51) Int. Cl.
*H03K 19/094*    (2006.01)
(52) U.S. Cl. .................. 326/82; 83/86; 83/87
(58) Field of Classification Search .......... 326/82, 326/83; 327/108, 112, 51, 52
See application file for complete search history.

(56) References Cited

U.S. PATENT DOCUMENTS

| | | | |
|---|---|---|---|
| 6,426,656 B1 * | 7/2002 | Dally et al. ............ 327/51 |
| 6,556,089 B2 | 4/2003 | Wood | |
| 6,927,599 B2 * | 8/2005 | Ju et al. ................. 326/14 |
| 2001/0052796 A1 * | 12/2001 | Tomita ................. 326/83 |
| 2002/0149400 A1 * | 10/2002 | Kocaman .............. 327/65 |
| 2002/0190805 A1 | 12/2002 | Wood | |
| 2003/0006851 A1 | 1/2003 | Wood | |
| 2003/0067337 A1 * | 4/2003 | Yin et al. ............ 327/210 |
| 2003/0151465 A1 | 8/2003 | Wood | |
| 2003/0198296 A1 * | 10/2003 | Bonelli et al. .......... 375/257 |
| 2004/0239369 A1 * | 12/2004 | Hsu et al. ............. 326/115 |
| 2005/0010883 A1 | 1/2005 | Wood | |
| 2005/0225365 A1 | 10/2005 | Wood | |
| 2005/0251775 A1 | 11/2005 | Wood | |
| 2006/0022720 A1 | 2/2006 | Wood | |
| 2006/0071844 A1 | 4/2006 | Wood | |

FOREIGN PATENT DOCUMENTS

| | | |
|---|---|---|
| GB | 2358563 A | 7/2001 |
| GB | 2399243 A | 9/2004 |
| WO | WO 00/44093 | 7/2000 |
| WO | WO 01/67603 A1 | 9/2001 |

(Continued)

OTHER PUBLICATIONS

E. Seevinck, P. van Beers, and H. Ontrop, Current-Mode Techniques for High-Speed VLSI Circuits with Application to Current Sense Amplifier for CMOS IEEE J. Solid-State Circuits, vol. 26, No. 4, pp. 523-536 Apr. 1991.

(Continued)

*Primary Examiner*—Rexford Barnie
*Assistant Examiner*—Thienvu V Tran
(74) *Attorney, Agent, or Firm*—Baker Botts L.L.P.

(57) ABSTRACT

Disclosed are on-chip global electrical signaling systems and methods employing differential current-mode sensing having reduced delay and energy dissipation compared to conventional inverter repeaters. The present inventions can be used for point-to-point connections as well as N-to-1 connections.

25 Claims, 9 Drawing Sheets

FOREIGN PATENT DOCUMENTS

WO        WO 01/89088 A1    11/2001
WO        WO 03/048979 A2    6/2003

OTHER PUBLICATIONS

T. Blalock, R. Jaeger, Jaeger, "A High-Speed Clamped Bit-Line Current-Mode Sense Amplifier", IEEE J. Solid-State Circuits, vol. 26, No. 4, pp. 542-548 Apr. 1991.

Travis N. Blalock and Richard C. Jaeger, " A High-Speed Sensing Scheme for 1T Dynamic RAM's Utilizing the Clamped Bit-Line Sense Amplifier", IEEE Journal of Solid-State Circuits, vol. 27, No. 4, pp. 618-625, Apr. 1992.

M. Izumikawa, M. Yamashina, "A Current Direction Sense Technique for Multiport SRAM's", IEEE Journal of Solid-State Circuits, vol. 31, No. 4, Apr. 1996.

H. Zhang, V. George, and J. M. Rabaey, "Low-Swing On-Chip Signaling Techniques: Effectiveness and Robustness," *IEEE Trans. on VLSI Systems*, vol. 8, No. 3, pp. 264-272, Jun. 2000.

Y. Takao, et al., "A 0.11μm CMOS Technology with Copper and Very-low-k Interconnects for High-Performance System-On-a Chip Core," in *Proc. International Electron Devices Meeting*, San Francisco, CA, Oct. 2000, pp. 559-562.

R. Ho, K. Mai, and M. Horowitz, "The Future of Wires," in *Proc. of IEEE*, vol. 89, No. 4, pp. 490-504, Apr. 2001.

A. Maheshwari, "Current-Sensing Methods for Global Interconnects in Very Deep Sub-Micron (VDSM) CMOS", M.Sc. Thesis, Dept. of Electrical and Computer Engineering, Univ. of Massachusetts Amherst, Sep. 2001.

A. Katoch, E. Seevinck, and H. Veendrick, "Fast Signal Propagation for Point On-Chip Long Interconnects using Current Sensing," in *Proc. IEEE European Solid-State Circuits Conference*, Firenze, Italy, Sep. 2002, pp. 195-198.

M. Sinha, "Low-Voltage Sensing Techniques for High-Speed On-Chip Global Interconnects and Caches", M.Sc. Thesis, Dept. of Electrical and Computer Engineering, Univ. of Massachusetts Amherst, Sep. 2002.

A. Maheshwari, W. Burleson, "Repeater and Current-sensing Hybrid Circuits for On-chip Interconnects", Great Lake Symposium on VLSI, Washington, DC, Apr. 28-29, 2003.

R. Ho, K. Mai, and M. Horowitz, "Efficient On-Chip Global Interconnects," in *IEEE Symp. on VLSI Circuits*, Kyoto, Japan, Jun. 2003, pp. 271-274.

R. Rao, e.a., "Approaches to Run-time and Standby Mode Leakage Reduction in Global Buses," *International Symposium on Low Power Electronics and Design*, Newport Beach, CA, Aug. 2004, pp. 188-193.

A. Maheshwari and W. Burleson, "Differential Current-Sensing for On-Chip Interconnects," *IEEE Trans. on VLSI Systems*, vol. 12, No. 12, pp. 1321-1329, Dec. 2004.

A. P. Jose, G. Patounakis, and K. L. Shepard, "Near Speed-of-Light On-Chip Interconnects Using Pulsed Current-Mode Signaling," in *IEEE Symp. on VLSI Circuits*, Kyoto, Japan, Jun. 2005, pp. 108-111.

W. Burleson, "VLSI Interconnects: Solutions from Circuits to Architectures", SRC Review Presentation, 2001.

\* cited by examiner

SYSTEMS AND METHODS FOR TRANSMITTING SIGNALS ACROSS INTEGRATED CIRCUIT CHIPS

CROSS-REFERENCE TO RELATED APPLICATIONS

This application claims priority to U.S. Provisional Patent Application Ser. No. 60/731,195 filed on Oct. 28, 2005, entitled "SYSTEMS AND METHODS FOR TRANSMITTING SIGNALS ACROSS INTEGRATED CIRCUIT CHIPS," the entire disclosure of which is incorporated herein by reference.

FIELD OF THE INVENTION

The present invention relates to systems and methods for transmitting electrical signals across integrated-circuit chips and the like.

BACKGROUND OF THE INVENTION

Typically, integrated-circuit interconnects are categorized according to their length, generally falling within three categories: (1) local interconnects that connect gates within a block, (2) semi-global interconnects that connect blocks (e.g., datapath blocks to a register file), and (3) global interconnects that connect functional units together such as a processor core with the L2 cache, the bus interface, or another processor core in a chip multiprocessor. As CMOS processes scale, local interconnect length, and to a lesser extent semi-global interconnect length, scales as well. However, global interconnects tend to become longer because maximum die sizes are increasing. Global interconnect capacitance increases since capacitance per unit length remains constant or only slightly decreases as processes scale. When coupled with resistance increases per unit length, the result is slower absolute global data transfer, and much slower transfer relative to increasing system clock frequencies. Thus scaling results in both more $fCV^2$ power and increased latency in the global interconnects. A solution that addresses both of these problems is needed.

SUMMARY OF THE INVENTION

We describe new current-mode transmission systems and methods for global and semi-global interconnects that reduce both delay and energy dissipation compared to the standard inverter repeater approach. For exemplary methods and systems according to the present invention, a first interconnect wire and a second interconnect wire are disposed on an integrated-circuit chip, with each interconnect wire having a first end in a first area of the chip and a second end in a second area of the chip. In exemplary systems according to the present invention, a transmission circuit generates a differential current, or current difference, at the first ends that is sensed at the second ends by a reception circuit, which preferably comprises a current-mode sense amplifier. In preferred system embodiments, control signals may be used to enable both the transmission circuit and the reception circuit to reduce static power.

In exemplary method embodiments, at least one current is coupled at one of the first ends of the interconnect wires during a first period of time to generate a current difference in the interconnect wires that propagates from the first ends of the interconnect wires to the second ends of the interconnect wires. The current difference has a first sign to represent a first value of data transmitted and a second sign to represent a second value of data transmitted. The exemplary methods further comprise sensing the sign of the current difference at the second ends of the interconnect wires, and discharging the currents in the first and second interconnect wires in a second period of time that follows after the first period of time, so that substantially no current flows in the interconnect wires just prior to the next transmission of data.

In further preferred embodiments, N-to-1 interconnections can be implemented, e.g., multiple transmission circuits and a single reception circuit.

It is an object of the present invention to provide for faster transmission of electrical signals across integrated-circuit chips and the like.

It is another object of the present invention to reduce the power required to convey electrical signals across integrated-circuit chips and the like.

These and other objects of the present invention will become apparent to those skilled in the art from the following detailed description of the invention, the accompanying drawings, and the appended claims.

DETAILED DESCRIPTION OF THE INVENTION

In the following description, numerous specific details are set forth to provide a more thorough description of the specific embodiments of the invention. It is apparent, however, that the invention may be practiced without all the specific details given below. In other instances, well-known features have not been described in detail so as not to obscure the invention. It is also noted that, in the circuit diagrams, two wires that cross one another are not electrically connected to one another unless a connection dot is present at their intersection. It is further noted that a signal name (or structure) ending with the asterisk (*) symbol, or having a bar over it (such as that used in FIG. 7), denotes the inverted version, or complementary version, of the signal (or structure) identified by the name alone (for example, signal din* is the inverted version of signal din, and interconnect wire dwire* is the complementary structure to interconnect wire dwire).

Figure 1:
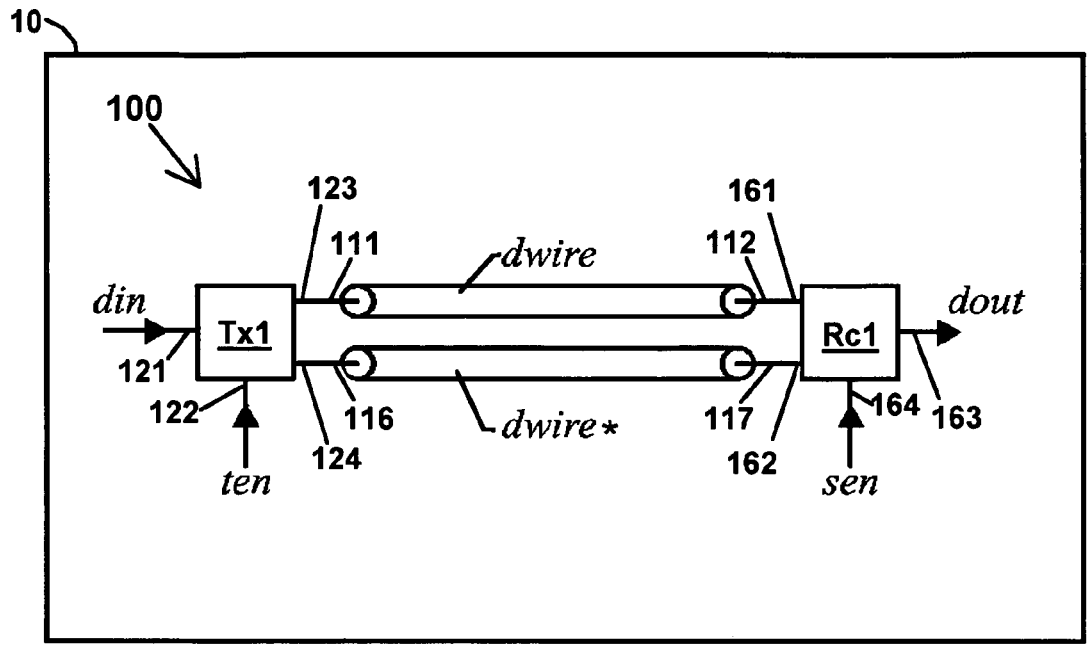
FIG. 1 shows a first exemplary signal-transmission system according to the present invention.

FIG. 1 shows a first exemplary embodiment of a signal-transmission system 100 according to the present invention, which is disposed on an integrated-circuit substrate 10. System 100 comprises a first interconnect wire dwire, which has a first end 111 and a second end 112, a second interconnect wire dwire*, which has a first end 116 and a second end 117, and first transmission circuit Tx1. First and second interconnect wires dwire and dwire* preferably run side-by-side to one another from their first ends to their second ends, with the first ends being located in one area of the chip, and their second ends being located in another area of the chip. As such, the separation distance between first ends 111 and 116 is typically much less than the separation distance between the first and second ends of each interconnect wire (which is typically the length of the interconnect wires), and the separation distance between second ends 112 and 117 is also typically much less than the separation distance between the first and second ends of each interconnect wire. The interconnect wires are generally disposed side-by-side in the same horizontal plane, but they may be stacked side-by-side in the vertical direction (e.g., over one another). First transmission circuit Tx1 has a data input 121 to receive a data signal din that is to be transmitted by system 100, an enable port 122 to receive a transmission-control signal ten, a first output 123 coupled to first end 111 of first interconnect wire dwire, and a second output 124 coupled to first end 116 of second interconnect wire dwire*. The data signal din is capable of having a first data value and a second data value, such as binary values "0" and "1." The transmission-control signal ten is capable of having a transmission enable state and a transmission disable state, which may be assigned respective voltage levels. System 100 further comprises a reception circuit Rd, which has a first input 161 coupled to second end 112 of first interconnect wire dwire, a second input 162 coupled to the second end 117 of second interconnect wire dwire*, and a data output 163 to provide a signal representation dout of a data value received at its inputs. In preferred embodiments, reception circuit Rc1 further comprises an enable port 164 to receive a reception-control signal sen, which is capable of having a reception enable state and a reception disable state. These states may be assigned respective voltage levels. As described in greater detail below, reception circuit Rc1 comprises a current-mode sense amplifier that senses the current differences present at the second ends of interconnect wires dwire and dwire.

The first and second interconnect wires dwire and dwire* provide a differential interconnect whereby a representation of the data value of data input din can be transmitted over the wires as a difference in currents. The difference in currents is received and detected by reception circuit Rc1, which generates the data value of data input din from the detected current difference. The difference in currents is uniquely correlated with the possible data values of din. Each current coupled at an interconnect wire by first transmission circuit Tx1 at its first end can have a positive value (in which case the current flows from Tx1 to Rc1), a negative value (in which case the current flows from Rc1 to Tx1), or a substantially zero value. To provide a positive current, transmission circuit Tx1 can have a sourcing current source; to provide a negative current, transmission circuit Tx1 can have a sinking current source; to provide substantially zero current, transmission circuit can place the first end of the wire in a floating state, or couple the first end to a constant potential that is the same as that present at the corresponding input of reception circuit Rc1. As one illustrative embodiment, when din has a binary "1" value, no current is coupled to first interconnect wire dwire (substantially zero current), while a positive current I is coupled to the first end of second interconnect wire dwire*; and when din has a binary "0" value, a positive current I is coupled to the first end of first interconnect wire dwire while no current is coupled to second interconnect wire dwire* (substantially zero current).

Transmission-control signal ten controls the operation of transmission circuit Tx1, and reception-control signal sen controls the operation of reception circuit Rc1. When transmission-control signal ten is in its enable state, which preferably occurs when input din becomes stable or shortly thereafter, transmission circuit Tx1 responds by coupling currents to first ends 111 and 116 of the interconnect wires according to the data value of data signal din. When transmission-control signal ten is in its disable state, transmission circuit Tx1 responds by terminating the coupling of the currents. Although in preferred embodiments of the present invention the interconnect wires are always clamped to a predefined voltage (e.g., ground or the supply voltage), voltages can be built up on the wires when transmission circuit Tx1 couples currents to them. To address this, transmission-control circuit Tx1 preferably further responds to the disable state of signal ten by dissipating the currents that have been previously built up in the interconnect wires and by resetting the voltages on the interconnect wires to predefined values before the next data transfer.

In preferred embodiments, the currents coupled to first ends 111 and 116 of the interconnect wires by transmission circuit Tx1 are coupled only for as long as needed to develop a detectable current difference at the second ends 112 and 117 of the interconnect wires. This provides the benefit of minimizing power dissipation. As described below in greater detail, a current-mode sense amplifier for reception circuit Rc1 can be configured to respond to a pulse of current difference in order to generate output dout, and need not have a continuous current difference present at the second ends 111 and 116 of the interconnect wires. However, it may be appreciated that embodiments of the present invention can be practiced with continuous current differences present.

When reception-control signal sen is in its enable state, which preferably occurs when a detectable current difference has been built up at the second ends 112 and 117 of the interconnect wires, reception circuit Rx1 preferably responds by enabling its current-mode sense amplifier to detect the current difference and its sign. Once the current-mode sense amplifier has detected the current difference and generated an output dout in relation to the current difference, reception-control signal sen can be placed in its disable state. When control signal sen enters its disable state, reception circuit Rc1 preferably responds by resetting its current-mode sense amplifier in preparation for the next data transfer. In preferred embodiments, the current-mode sense amplifier does not draw power during its resetting.

Figure 2:
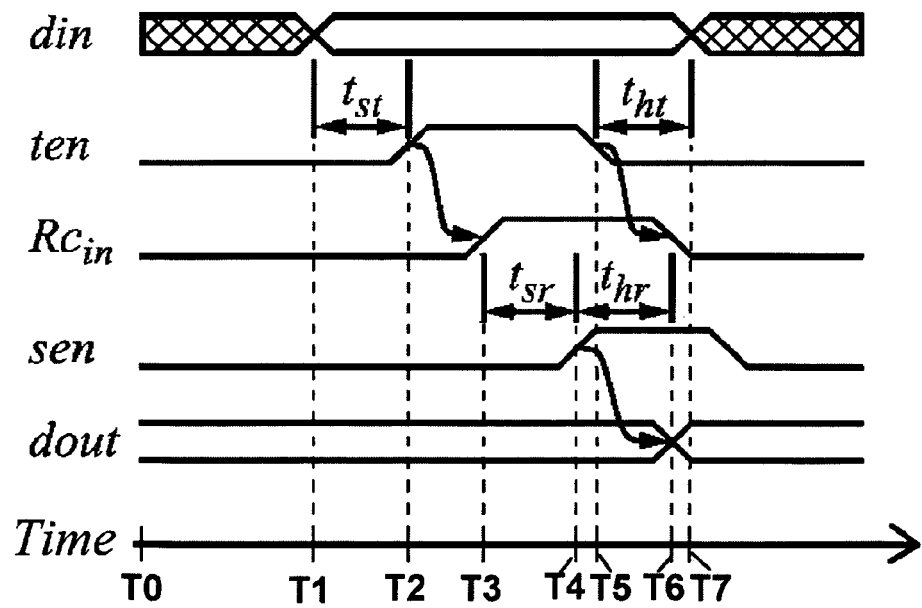
FIG. 2 shows a timing diagram for the exemplary signal-transmission system shown in FIG. 1 according to the present invention.

FIG. 2 shows a timing diagram that illustrates an exemplary operation of control signals ten and sen in a preferred exemplary embodiment of system 100. In this example, for the purposes of illustration and without loss of generality, the disable states of control signals ten and sen are each shown by a low level on the diagram, and the enable states are each shown by a high level on the diagram. The timing diagram starts at time point T0 with control signals ten and sen in their disable states, with no current difference (RCin) at the second ends of the interconnect wires, and with data input din undergoing switching in accordance with the circuitry that determines its value. By time point T1, data input din has entered a stable state and is thereafter ready to be transmitted by system 100. At this point, or shortly thereafter, transmission enable signal ten transitions to its enable state, which is shown at time point T2. Transmission circuit Tx1 thereafter couples the currents at the first ends 111 and 116 of the interconnect wires, and an amount of time thereafter, as indicated at time point T3, a current difference RCin is presented at the second ends 112 and 117 of the interconnect wires for the reception circuit Rc1 to detect. A time period thereafter, reception-control signal sen may enter its enable state, as indicated at time point T4, which activates the current-mode sense amplifier of reception circuit Rc1. Thereafter, the current-mode sense amplifier evaluates current difference RCin to generate output signal dout at time point T6. After time point T6, both control signals can transition back to their disable states. However, transmission enable signal ten may transition back earlier, such as at time point T5, which results in a shorter current pulse propagating through the wire. The shorter current pulse can still be detected, and its reduced pulse width reduces power consumption by transmission circuit Tx1. In some instances, such as for long runs of interconnect wire, transmission enable signal ten may transition back to its disable state concurrent with reception enable signal sen transitioning to its enable state (time point T4), or beforehand (such as a time point-between T3 and T4).

In FIG. 2, a number of timing relationships are shown. Timing relationship $t_{st}$ is the set-up time of data input din relative to the transition of transmission-control signal ten from its disable state to its enable state. This is the minimum amount of time that data input din is to be stable prior to the transition in control signal ten, or alternatively, the amount of time control signal ten is to wait after input din stabilizes before transitioning to its enable state. In general, set-up time $t_{st}$ can be positive, zero, or negative, depending upon the implementation of transmission circuit Tx1. Timing relationship $t_{ht}$ is the hold time of data input din relative to the transition of transmission-control signal ten from its enable state to its disable state. This is the minimum amount of time that input din is to remain stable after transmission-control signal ten transitions from its enable state to its disable state. In general, hold time $t_{ht}$ can be positive, zero, or negative, depending upon the implementation of transmission circuit Tx1. We note that this hold time can be referenced from the initial transition of control signal ten from its disable state to its enable state; in this case, the hold time would generally have a positive value.

Timing window $t_{sr}$ is the set-up time of the start of current-difference pulse RCin relative to the transition of reception-control signal sen from its disable state to its enable state. This is the minimum amount of time that current-difference pulse RCin is to be at a level detectable by the current-mode sense amplifier prior to the transition in control signal sen, or alternatively, the amount of time the transition in control signal sen is to wait after the current-difference pulse RCin has reached a detectable level. In general, set-up time $t_{sr}$ can be positive, zero, or negative, depending upon the implementation of reception circuit Rc1. Timing window $t_{hr}$ is the hold time of current-difference pulse RCin relative to the transition of control signal sen from its enable state to its disable state. This is the minimum amount of time that current-difference pulse RCin is to remain at a detectable level after reception-control signal ten transitions to its enable state. In general, hold time $t_{hr}$ has a positive value.

Although the timing relationships appear complex, they are relatively easy to provide for. For example, control signals ten and sen can be generated from a global clock signal, such as provided to the respective areas of transmission circuit Tx1 and reception circuit Rcd by way of a clock tree. If circuits Tx1 and Rcd are within the same region of the semiconductor chip that is served by a regional clock signal, then control signals ten and sen can be generated from that regional clock signal. In addition, a latch that is responsive to such a clock signal may be used to latch in a data value for input din. As one implementation, input din may be generated by such a latch on the positive edge of a first local version of a global clock signal that is near transmission circuit Tx1. Also in this implementation, transmission-control signal ten may be generated as a delayed version of the first local version of clock signal (such as generated by a string of one or three inverters), and reception-control signal sen may be generated as an inverted version of a second local version of the global clock signal that is near reception circuit Rc1.

Figure 3:
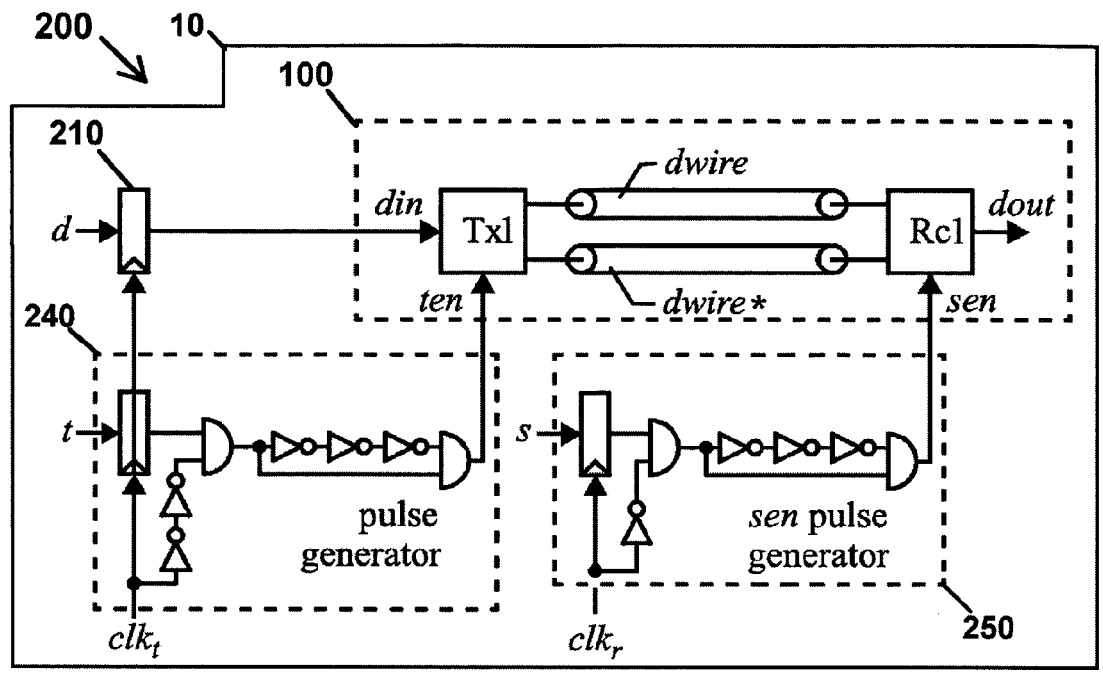
FIG. 3 illustrates a second exemplary system according to the present invention.

A second timing implementation is illustrated in FIG. 3 by a second exemplary signal-transmission system 200 according to the present invention. System 200 includes system 100, a data latch 210 that is responsive to a first clock signal $Clk_t$, a first timing-control circuit 240 that generates transmission-control signal ten from first clock signal $Clk_t$ and transmission command signal t, a second timing-control circuit 250 that generates reception-control signal sen from a second clock signal $Clk_r$. First and second clock signals can be generated from a common global clock signal and clock tree, with first clock signal $Clk_t$ being located in close proximity to transmission circuit Tx1, and second clock signal $Clk_r$ being located in close proximity to reception circuit Rc1. First timing-control circuit 240 comprises a latch (e.g., flop-flop) for receiving signal t, and a pulse generator that receives the output of the latch for signal t and a version of first clock signal $Clk_t$ that is delayed by two inverters. Transmission-control signal ten is provided at the output of the pulse generator. Second timing-control circuit 250 comprises a latch for receiving signal s, and a pulse generator that receives the output of the latch for signal s and a version of second clock signal $Clk_r$ that is delayed by one inverter. Reception-control signal sen is provided at the output of the pulse generator. At the positive edge of clock signals $Clk_t$ and $Clk_r$, signals d, t, and s become available at the outputs of their corresponding latches. The pulse generator of circuit 240 generates signal ten from the latched signal t and a delayed version of first clock signal $Clk_t$; this arrangement prevents a glitch in the generation of signal ten. The pulse width of signal ten is controlled by the delay through the inverters, which may in turn be set by their number (odd number), design, and addition of capacitance at the nodes between inverters. Reception signal sen is generated by circuit 250 in a similar way as that for signal ten, but using the negative edge of second clock signal $Clk_r$. It is not necessary to delay $Clk_r$ since signal s is already available at the output of the latches at the beginning of the cycle, although it may be beneficial or necessary to delay the output of the latch of circuit 250, depending upon the particular construction used in the sense amplifier. Using the half-cycle data transfer approach shown in FIG. 3 allows the interconnects to be reset during the other half of the clock cycle.

Exemplary Embodiments for Transmission Circuit Tx1

Transmission Circuit Tx1 can be implemented in a number of ways, with each, way generally having at least two current sources to selectively couple currents at the first ends of the interconnect wires dwire and dwire* (a current source may couple a positive current at an interconnect wire by directing current into the first end of the interconnect wire, and may couple a negative current at a wire by drawing current from the first end of the wire). Signal ten controls the current sources and inhibits the current(s) on the wires after the data transfer has completed. In exemplary embodiments of the present invention, the interconnect wires dwire and dwire* are clamped to ground potential, and pFETs (e.g., PMOS transistors) that draw current from the supply voltage are used as current sources. Two such exemplary implementations are shown next: a Single-PFET (SiPF) implementation and Stacked-PFET (StPF) implementation. The former is shown at 220 in FIG. 4, which comprises two inverters, two NAND gates, two PMOS transistors (pFETs) $MP_1$ and $MP_2$, and two NMOS transistors (NFETS) $MN_1$ and $MN_2$, interconnected as shown in the figure. As is known in the art, pFET transistors use holes as the majority carriers in the channels region while nFETs use electrons, and for this reason a pFET and an nFET are said to be transistors of opposite conductivity type. In single-pFET (SiPF) transmission circuit 220, the single pFETs $MP_1$ and $MP_2$ are selectively used as current sources. When transmission-control signal ten is in its enable state, such as with a high voltage (e.g., corresponding to a binary logic "1" value), one of pFETs $MP_1$ and $MP_2$ is active (i.e., conductive), depending on data input din, and current is being coupled at the first end of one of the interconnect wires. This selectivity is provided by the upper inverter and the two NAND gates. Pull-down nFETs $MN_1$ and $MN_2$ are non-conducting (i.e., turned off) during this time, due to the action of the lower inverter. This places the first end of the other one of the interconnect wires in a floating state (i.e., not coupled to any source of potential), whereby zero current is coupled to it. When ten is in its disable state, such as with a low voltage (e.g., corresponding to a binary logic "0" value), nFETs $MN_1$ and $MN_2$ are turned on and conductive (due to the action of the lower inverter) to couple the first ends to the ground potential, which discharges the interconnect wires and initializes transmission circuit 220 for the next data transfer.

Figure 5:
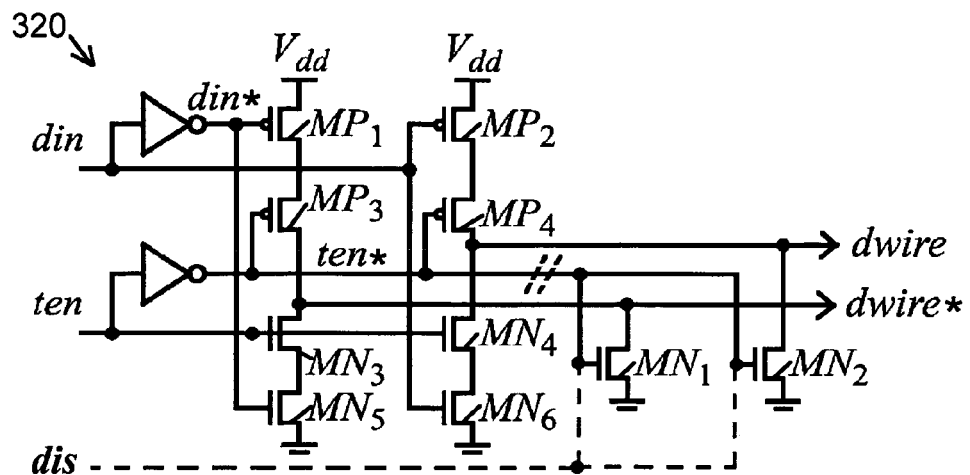
FIG. 5 illustrates a second exemplary transmission circuit according to the present invention.

The StPF transmission circuit implementation is shown at 320 in FIG. 5. StPF transmission circuit 320 comprises two inverters, four pFET transistors $MP_1$ through $MP_4$, and six nFET transistors $MN_1$ through $MN_6$, interconnected as shown in the figure. Transistors $MP_1$ and $MP_2$ provide the current sources (as in transmission circuit 220 ), but the current flow coupling is controlled by pFETs $MP_3$ and $MP_4$ placed between the current sources and interconnect wires dwire and dwire*. These pFETs are enabled when ten is in its enable state (e.g., high voltage, binary value "1"). Depending on the value of data input signal din, current flows to one of dwire or dwire*. Another difference compared to the SiPF transmission circuit is that when ten is in its enable state, the interconnect wire with zero current (i.e., dwire or dwire*) is actively clamped to the ground potential from the transmission circuit side through $MN_3$ and $MN_5$ (for dwire*) or $MN_4$ and $MN_6$ (for dwire). Transistors $MN_1$ and $MN_2$ provide the same function as they provide in SiPF transmission circuit 220.

Figure 4:
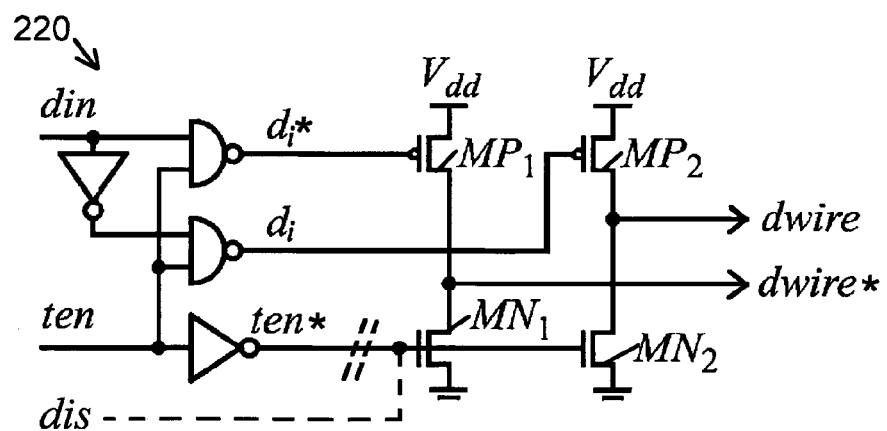
FIG. 4 illustrates a first exemplary transmission circuit according to the present invention.

In FIGS. 4 and 5, there are shown dotted connection lines of a signal dis to the gates of transistors $MN_1$ and $MN_2$, and a set of dashed cut lines on the signal line of ten* that goes to the gates of these transistors. These features illustrate further embodiments of the transmission circuits suitable for another exemplary system according to the present invention that is described below with reference to FIG. 8A, where multiple transmission circuits 220 and/or 320 are coupled to a single set of interconnect wires, and where the use of signal dis in place of signal ten* solves a contention issue that is described below.

In transmission circuits 220 and 320, currents were selectively coupled to the interconnect wires. This is suitable for implementations where the interconnect wires are clamped toward ground potential (zero), or clamped toward a voltage that is between zero and the supply voltage Vdd. In some implementations of the present invention, the interconnect wires may be clamped toward the supply voltage Vdd, or clamped toward a voltage that is between ground and Vdd. In such cases, it may be useful to have a transmission circuit that selectively drains current from the interconnect wires. Such a transmission circuit may be constructed as the complementary circuit of transmission circuit 220 or transmission circuit 320. In general, a complementary circuit can be derived from a given circuit by vertically flipping the original circuit, exchanging the individual pFETs with nFETs, exchanging the individual nFETs with pFETs, exchanging the supply voltage Vdd and ground potential, and maintaining the gates and inverters of the circuit in the original configuration, but adding a stage of inversion wherever an output of a gate or inverter provides a drive signal to an individual transistor. With this knowledge, one of ordinary skill in the art can construct versions of transmission circuits 220 and 320 that drain current from the interconnect wires.

Exemplary Embodiments for Reception Circuit Rc1

Figure 6:
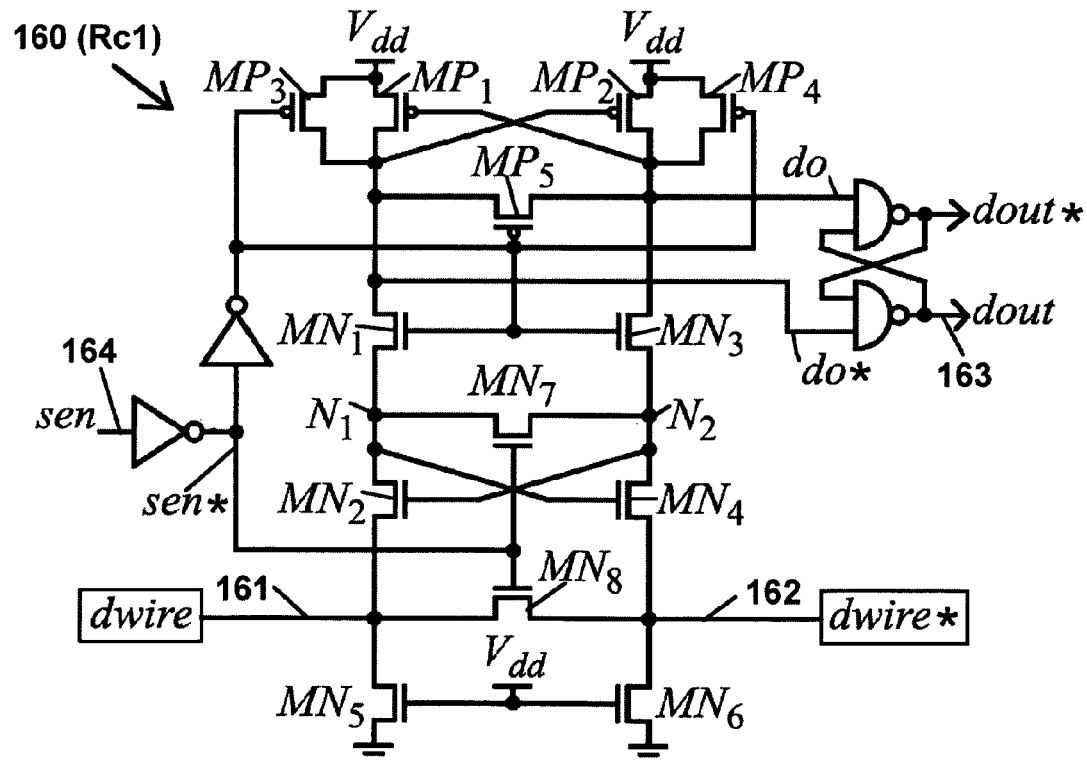
FIG. 6 illustrates an exemplary reception circuit according to the present invention.

FIG. 6 shows an exemplary embodiment for reception circuit Rc1 at 160. Reception circuit 160 comprises a current-mode sense amplifier whose inputs 161 and 162 are coupled to the second ends of interconnect wires dwire and dwire*, respectively, and whose outputs at nodes do and do* are coupled to a simple SR latch (SR flip-flop) formed by two cross coupled NAND gates, whose outputs provide output signals dout and dout* (output 163 ). NFETS $MN_5$ and $MN_6$ are configured as impedance elements that have substantially the same current-voltage relationship, and operate to maintain the second ends of interconnect wires dwire and dwire* within a target range close to the ground potential (e.g., they clamp the second ends toward the ground potential). NFETs $MN_1$, $MN_2$, $MN_3$, and $MN_4$ form a current-sensing structure that detects an imbalance in the currents presented at the second ends of the interconnect wires. PFETs $MP_1$, $MP_2$, $MP_3$, $MP_4$, and $MP_5$ provide a current-driven voltage latch that generates output voltage on nodes do and do* in relation to the difference in currents flowing through the current-sensing structure formed by nFETS $MN_1$, $MN_2$, $MN_3$, and $MN_4$. When reception-control signal sen is in its disable state (e.g., low voltage, binary value "0"), transistors $MP_3$, $MP_4$, and $MP_5$ pre-charge internal nodes do and do* to Vdd, and the cross-coupled pFETS $MP_1$ and $MP_2$ are placed in non-conducting states. The two NAND gates that form an SR latch maintain the previously sensed data despite this pre-charging. Also during the disable state of reception-control signal sen, transistor $MN_7$ equalizes nodes $N_1$ and $N_2$ to approximately $V_{thn2}$, where $V_{thn2}$ is the nFET threshold voltage of transistors $MN_2$ and $MN_4$. Transistor $MN_8$ also equalizes the differential inputs dwire and dwire*. Also during the disable state, nIFETs $MN_1$ and $MN_3$ are turned off (i.e., nonconductive) which prevents the sense amplifier from drawing steady-state (continuous) power during the reset phase. When reception-control signal sen enters its enable state (e.g., high voltage, binary logic "1" value), the current difference between dwire and dwire* causes one of $N_1$ and $N_2$ to charge to approximately Vdd–$V_{thn1}$ (where $V_{thn1}$ is the threshold voltage of transistors $MN_1$ and $MN_3$) and the other to discharge to ground. The cross-coupling connection of nFETs $MN_2$ and $MN_4$ causes one of nFETs $MN_2$ or $MN_4$ to turn off while the other is still conducting. As a result, either node do or do* is discharged, and the new data is latched by the cross-coupled pFETs $MP_1$ and $MP_2$ of the current-driven latch, and in turn latched in the SR latch formed by the cross-coupled NAND gates. The output of the lower NAND gate provides at data output 163 an output signal dout that is a representation of a binary value received at the inputs 161 and 162 of reception circuit 160, and in turn at the inputs of the current-mode sense amplifier.

As indicated above, the transmission circuits 220 and 320 may be configured to selectively couple their currents to the interconnect wires (referred to herein as current with positive values), or may be configured to selectively couple their currents from the interconnect wires (referred to herein as current with negative values). Reception circuit 160 operates best when the transmission circuits selectively couple currents to interconnect wires dwire and dwire* (currents with positive values). In cases where the transmission circuits selectively couple currents from interconnect wires dwire and dwire* (currents with negative values), the complementary version of reception circuit 160 provides better operation. The complementary version can be derived from circuit 160 by vertically flipping the original circuit, exchanging the individual pFETs with nFETs, exchanging the individual nFETs with pFETs, exchanging the supply voltage Vdd and ground potential, and maintaining the gates and inverters of the circuit in the original configuration, but adding a stage of inversion where an output of a gate or inverter provides a drive signal to an individual transistor. In the complementary version of circuit 160, the interconnect wires are clamped toward the Vdd supply voltage.

Figure 7:
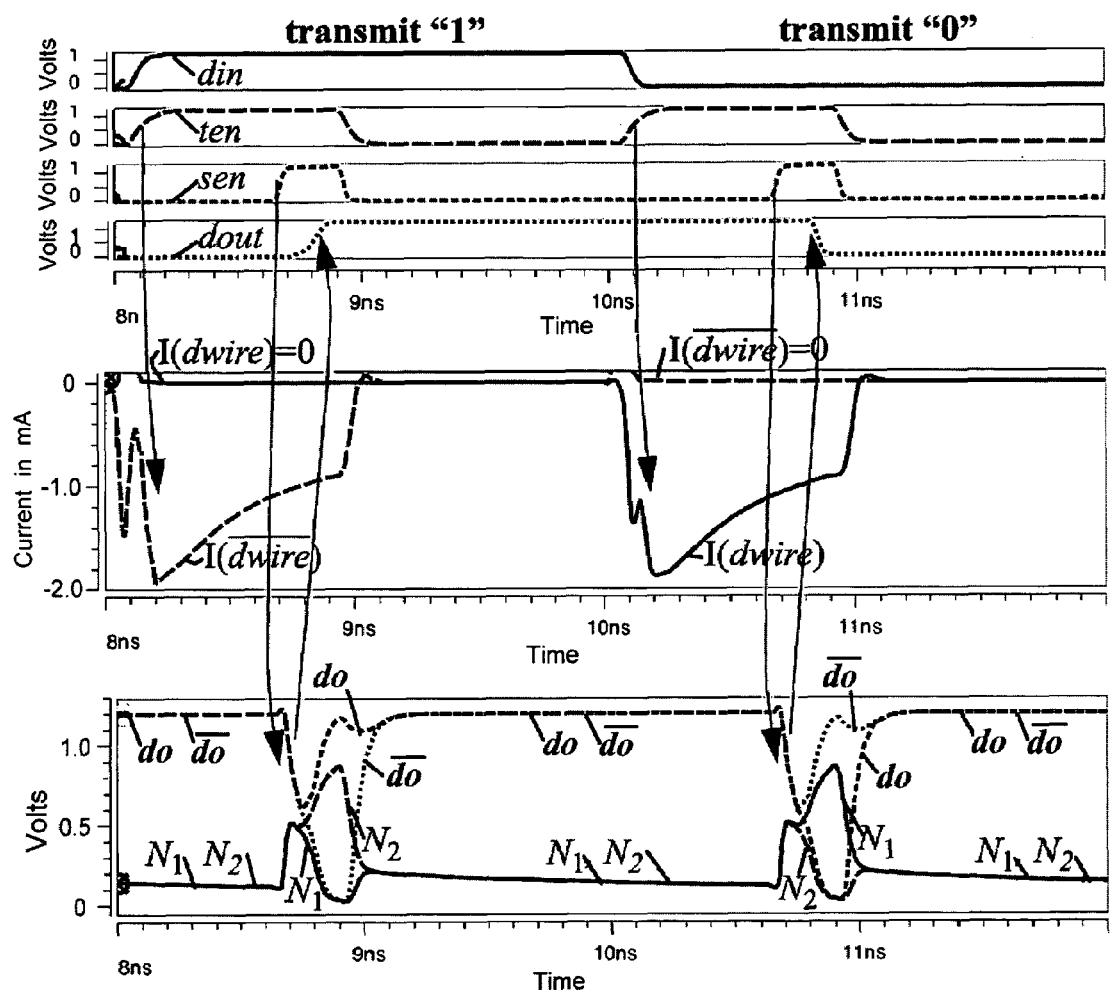
FIG. 7 shows a two-cycle timing diagram of an exemplary signal-transmission system according to the present invention.

FIG. 7 shows an HSPICE-generated two-cycle timing diagram for an exemplary signal-transmission system according to the present invention, where the timing diagram shows the internal signals of the sense amplifier when a "1" followed by a "0" are transmitted through the interconnect wires dwire and dwire*. The set-up time and hold time of the sense amplifier/latch depend on the amplitude of the input current. Simulated set-up time is 6 ps and hold time is 20 ps for 50 µA input current, decreasing to 2 ps set-up and 12 ps hold for 100 µA input current. It is noted that, due to an unrelated artifact of the simulation program, the currents I(dwire) and I(dwire*) shown in FIG. 7 have their signs inverted from their correct values (in other words, the waveforms for these currents should be flipped about the horizontal axis).

N-to-1 Tri-State Interconnect Embodiments

Being able to connect multiple tri-state transmission circuits (also called transmitters) in a single interconnect is useful for certain applications. Typically, an L2 cache is built using several SRAM macros with multiplexed outputs. Using the signal-transmission systems and methods according to the present invention, the outputs of the SRAM macros can drive a common bus. This is faster than using multiplexers and saves wiring. A similar application arises in multiple-processor chips where all processors share an L2 cache. Generally, in such applications, the processor output buses need to be multiplexed into a single bus that connects to the L2 cache. Using the present invention in these applications can simplify this connection as well.

Figure 8A:
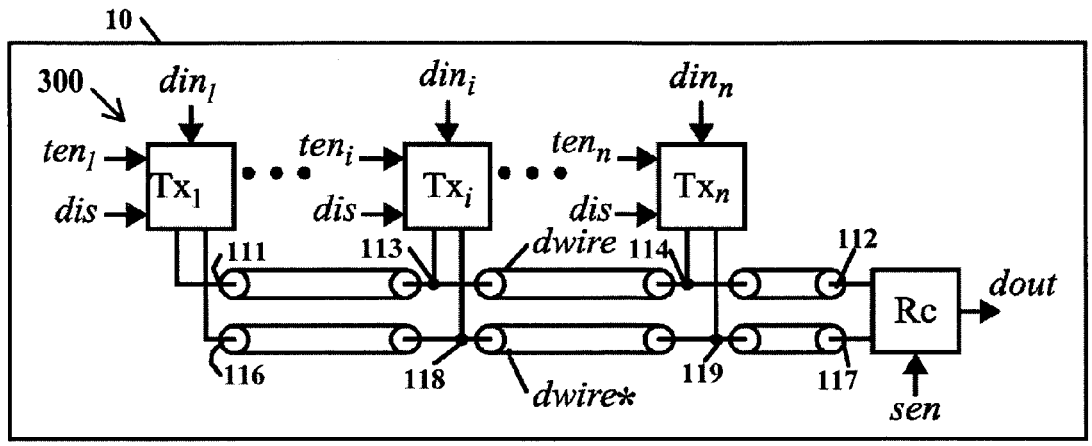
FIG. 8A illustrates a third exemplary signal-transmission system according to the present invention.
Figure 8B:
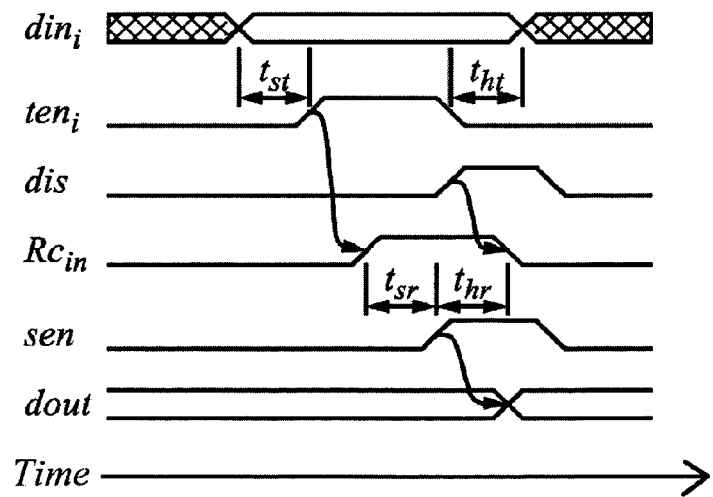
FIG. 8B shows a timing diagram for the exemplary system shown in FIG. 8A according to the present invention.

An exemplary signal-transmission system 300 according to the present invention that can realize the tri-state bus is shown in FIG. 8A, with a corresponding timing diagram shown in FIG. 8B. As before, transmission circuit Tx1 is coupled to the interconnect wires dwire and dwire* at first ends 111 and 116, and reception circuit Rcd is coupled to the second ends 112 and 117. The additional transmission circuits Txi and Txn are coupled at respective tap points on the interconnect wires dwire and dwire* (tap points 113 and 118 for Txi, and tap points 114 and 119 for Txn). Each one of the transmission circuits Tx1 through Txn can be individually controlled and enabled with its own transmit enable input (i.e., ten, for i=1, . . . , n), but individual ten,* signals should not be used to discharge the interconnect wires since this would cause contention. Instead, a signal dis drives nFETs $MN_1$ and $MN_2$ (as shown FIGS. 4 and 5 by the dotted connection lines of signal dis to the gates of these transistors, and by the dashed cut lines on the signal line of ten* to the gate of these transistors). Following the timing diagram of FIG. 8B, each transmission circuit can have its own signal dis that is enabled after it uses the interconnect wires, or all transmission circuits can pull-down the interconnect together. The latter would reduce the discharge time significantly. Circuitry for generating discharge signal dis can be accomplished in a number of ways. As one way, signal dis can be generated by a circuit that is identical to circuit 250 shown in FIG. 3, which generates reception-control signal sen, but with input "s" replaced by input "t." As a more simple way, signal dis can be generated as the inverted version of the global clock $clk_t$ shown in FIG. 3.

The time needed to discharge the currents in the interconnect wires during the reset phase of transmission can be reduced in all systems of the present invention by including several instances of transistors $MN_1$ and $MN_2$, as controlled by discharge signal dis, along the interconnect wires at several tap points, whether or not a transmission circuit is present at such a tap point. In other words, several "dummy" transmission circuits can be included in a system along with one or more regular transmission circuits, with each "dummy" transmission circuit only needing transistors $MN_1$ and $MN_2$.

Exemplary Methods

From the preceding discussion, it may be seen that exemplary methods of transmitting data across an integrated-circuit chip according to the present invention comprise coupling at least one current at one of the first ends of the interconnect wires during a first period of time to generate a current difference in the interconnect wires that propagates from the first ends of the interconnect wires to the second ends of the interconnect wires, with the current difference having a first sign to represent a first value of data transmitted and a second sign to represent a second value of data transmitted. The sign of the current difference can be defined by any standard convention, such as the value of current at the second end of the first interconnect wire minus the value of current at the second end of the second interconnect wire. The exemplary methods further comprise sensing the sign of the current difference at the second ends of the interconnect wires, and discharging the currents in the first and second interconnect wires in a second period of time that follows after the first period of time. For the N-to-1 tri-state embodiments, these actions are repeated at a subsequent time, but at a set of tap points of the interconnect wires.

Test Chip

Figure 9:
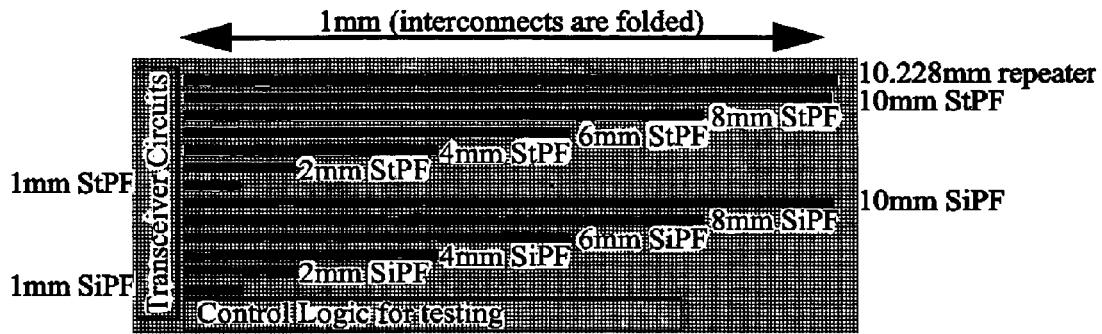
FIG. 9 shows a digitized photomicrograph of a test chip having embodiments of systems according to the present invention.

To assess the systems according to the present invention, a test chip shown in FIG. 9 was designed and fabricated in 0.11 µm, 1.2 V CMOS with copper interconnects, low-K dielectrics, and dual-$V_{th}$ FETs. Eight metal layers were available in this CMOS process, with metal 1 to metal 4 targeted for local interconnects, and metal 5 to metal 8, which are thicker and have coarser pitch, targeted for semi-global and global interconnects. Metal 5 was used for the test designs. The interconnect wires dwire and dwire* were laid out with minimum width and spacing. Each pair of interconnect wires was shielded on each side and shielded top and bottom with metal 6 and metal 4. The experimental chip contains 12 point-to-point transmission systems according to the present invention (also called herein "transceivers" for brevity). Each transmission circuit (SiPF and StPF) is paired six times with the same reception circuit for varying interconnect lengths (1 mm, 2 mm, 4 mm, 6 mm, 8 mm, and 10 mm). An inverter repeater-driven 10.228 mm interconnect was also included for comparison. The repeater size and spacing were optimized to minimize the delay per millimeter and its interconnect was shielded similar to the 12 transmission systems according to the present invention. All interconnects were folded so that the pairs of transmission and reception circuits could be placed close to each other to simplify the design.

Although the transmission systems on the test chip were shielded top and bottom with metal 6 and metal 4, in a real design there would be signals with various degrees of switching activity. HSPICE simulations using netlists with parasitic capacitances extracted from layouts indicate nearly-perfect common-mode noise rejection in a worst-case scenario in which all metal 4 and metal 6 coupling capacitance to the differential pair switches multiple times within a data transfer cycle.

Figure 10:
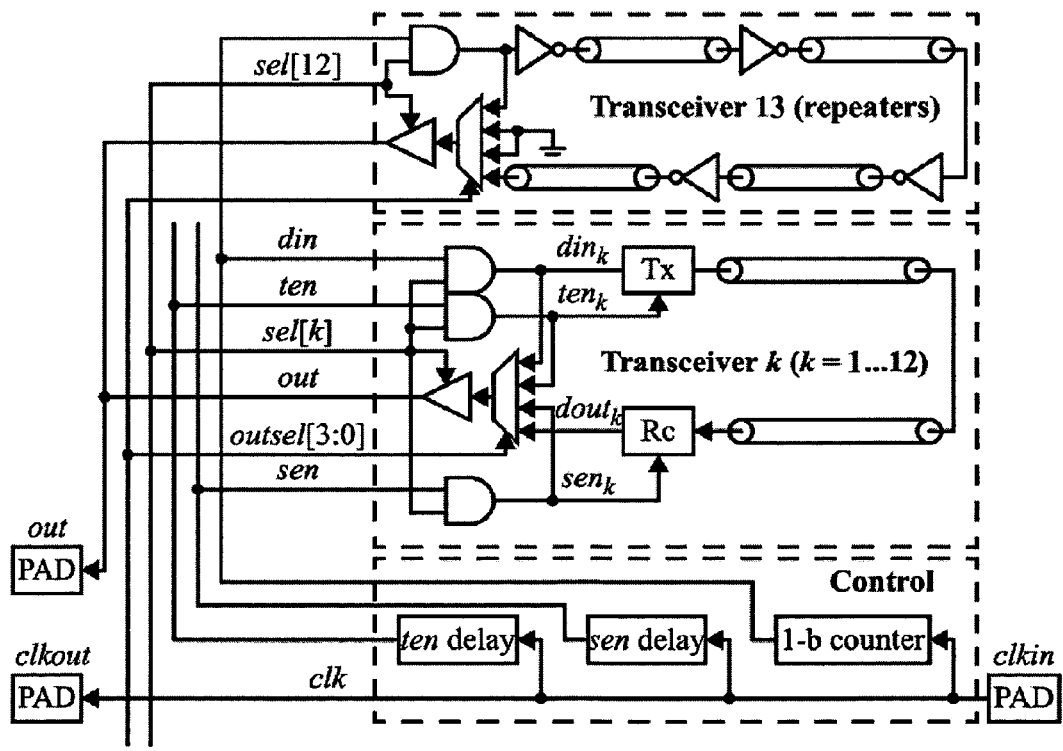
FIG. 10 is a schematic circuit diagram of the test chip shown in FIG. 9 according to the present invention.

To facilitate testing, control logic to generate din, ten, and sen from an external clock input clkin was included on the test chip. A schematic diagram of the control logic is shown in FIG. 10. A 1-bit counter (labeled "1-b counter" in the figure) generates input din so that it switches every cycle. Two delay lines generate signals ten and sen from clkin. These delay lines allow ten and sen to be spaced up to 1 nanosecond (ns) apart in time. One of the input/output signals $din_k$, $ten_k$, $sen_k$, or $dout_k$ of the selected transceiver can be fed to an I/O pad and externally viewed. Since each of these four signals has the same path to the output pad, out, the relative delay between any two of them can be determined by subtraction of the measured clkout to out delays. For each transmission circuit, in order to experimentally determine the optimum current source value for each wire length, the designs were modified to allow the width of the current-source pFETs to be statically varied from 0.5 µm to 31.5 µm using pFETs in series with the current sources. Therefore, in the test chip designs, SiPF and StPF transmission circuit sources have 2 and 3 stacked pFETs, respectively. Although the current was fine-tuned for this experiment, in practice the current of the transmission circuit should be decided through Monte Carlo or corner simulations based on the interconnect capacitance and resistance. An externally-fed shift register (not shown in FIG. 10) is used to select one out of the 13 transceivers to be tested, adjust the ten and sen delays, set the current-source strength, and select one of the transceiver signals to be externally viewed. For power measurements, a separate supply voltage powers the current sources of the transmission circuit and the reception circuit.

Measurements and Analysis

Figure 11:
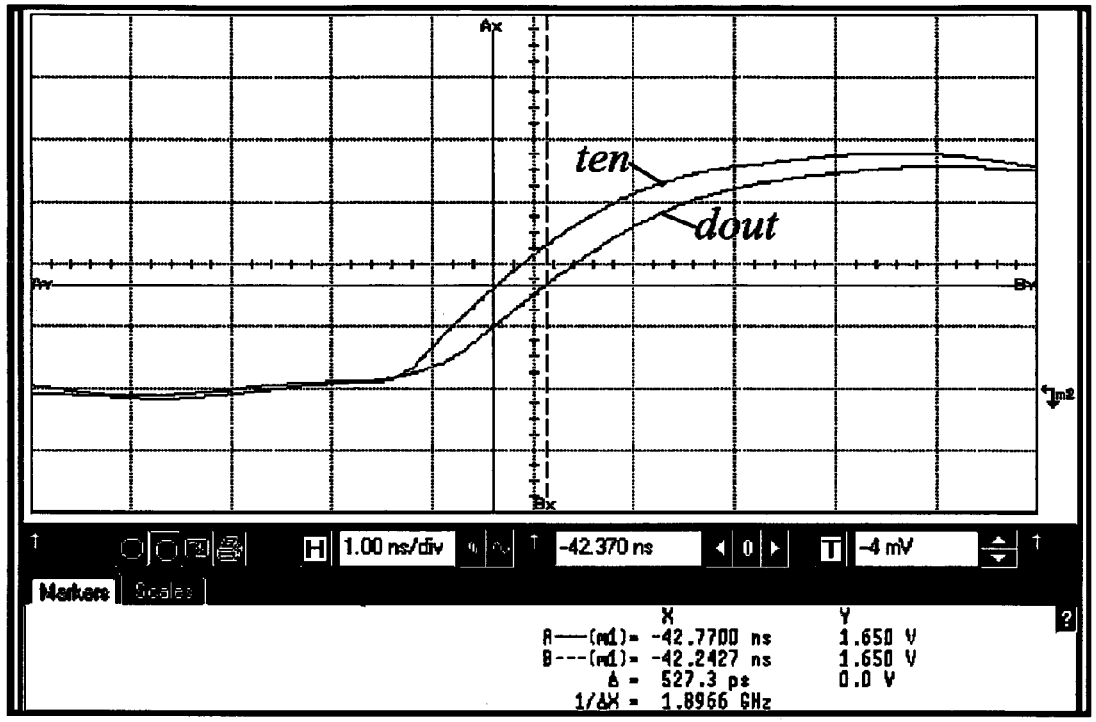
FIG. 11 shows oscilloscope waveforms for an exemplary transmission circuit according to the present invention.
Figure 12:
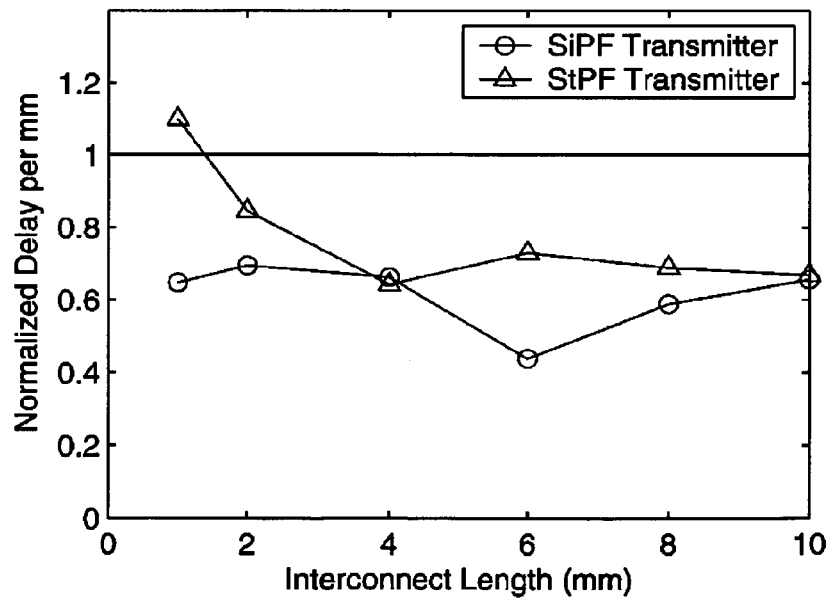
FIG. 12 illustrates a comparison of the delay-per-millimeter of interconnect wire between exemplary embodiments of transmission circuits according to the present invention.
Figure 13:
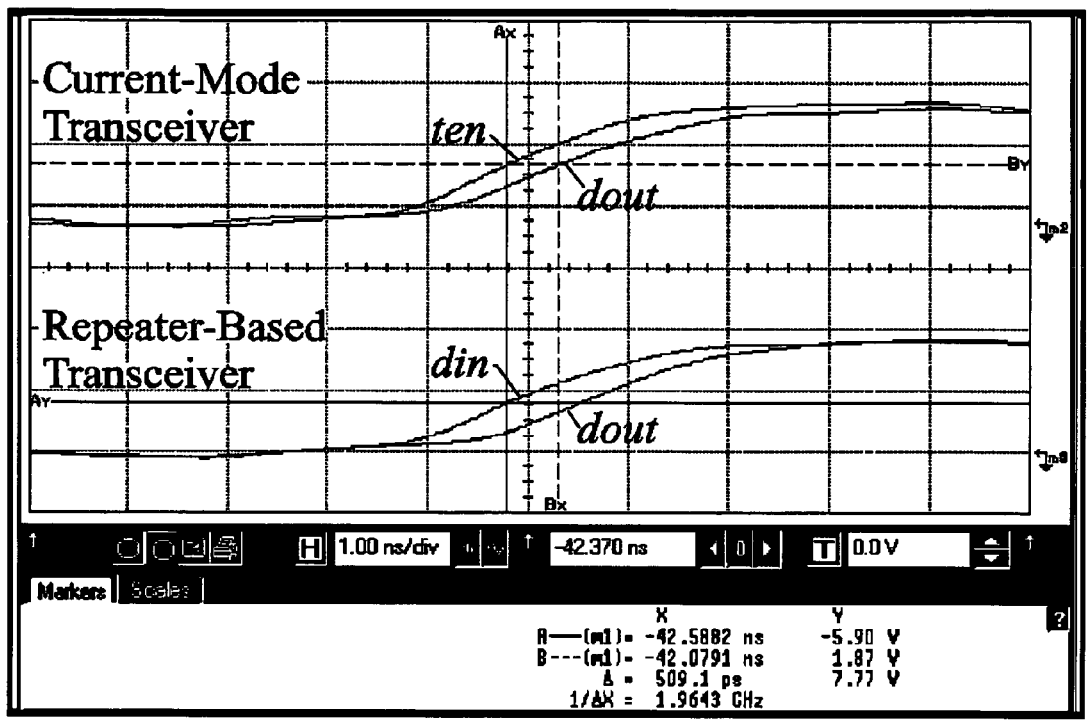
FIG. 13 illustrates the delay difference between an exemplary transmission system according to the present invention and a repeater-based system for a 10-millimeter interconnect.

With the test circuit shown in FIG. 10, delay and energy values could be measured. However, maximum operating frequency measurements were not possible since the bandwidth of the I/O pad buffers is smaller than the maximum operating frequency. FIG. 11 shows oscilloscope waveforms for one of the transmission circuits, albeit a more precise method to measure delay at 40 MHz was used. Delay was measured from ten to dout since din is stable when the transmission circuit is enabled. The ten delay from cikin was set to its minimum while the sen delay was increased until the transceiver under test operated successfully for maximum current. Subsequently, the current source width was decreased in order to find the optimum operating point. Since the experiment includes transceivers with various interconnect lengths, their delay-per-millimeter (mm) normalized to the repeater-driven interconnect delay-per-mm as a function of the interconnect length serves better for comparison, which is illustrated in FIG. 12. The measured delay of the 10.228 mm repeater-driven interconnect is 884 ps, i.e., 86.4 ps/mm (Table I below). The 10 mm SiPF and StPF transceiver measured delay is about 65% of the repeater delay-per-mm for both cases. In almost all the cases, the transceivers according to the present invention produce less than 70% of the repeater's delay-per-mm. FIG. 13 compares the delay difference between a 10 mm transceiver according to the present invention and the 10.228 mm repeater-based interconnect.

TABLE I

Delay comparison between the 10 mm current-mode transceivers according to the present invention and the 10.228 mm repeater-based transceiver.

| Transceiver | Interconnect Length | Delay | Delay/mm | Delay/mm Ratio |
|---|---|---|---|---|
| Repeater | 10.228 mm | 884 ps | 86.4 ps/mm | 1.00 |
| SiPF | 10 mm | 568 ps | 56.8 ps/mm | 0.65 |
| StPF | 10 mm | 578 ps | 57.8 ps/mm | 0.66 |

Figure 14:
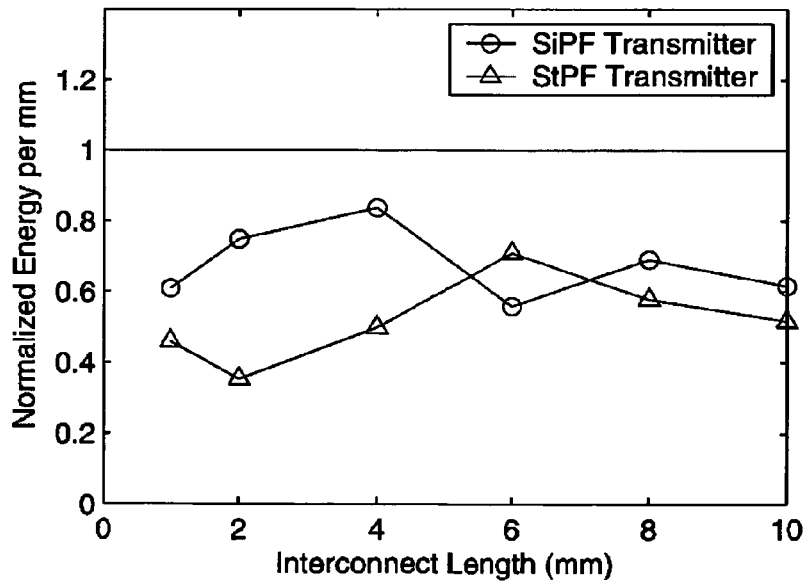
FIG. 14 illustrates a comparison of the energy-per-millimeter of interconnect wire between exemplary embodiments of transmission circuits according to the present invention.
Figure 15:
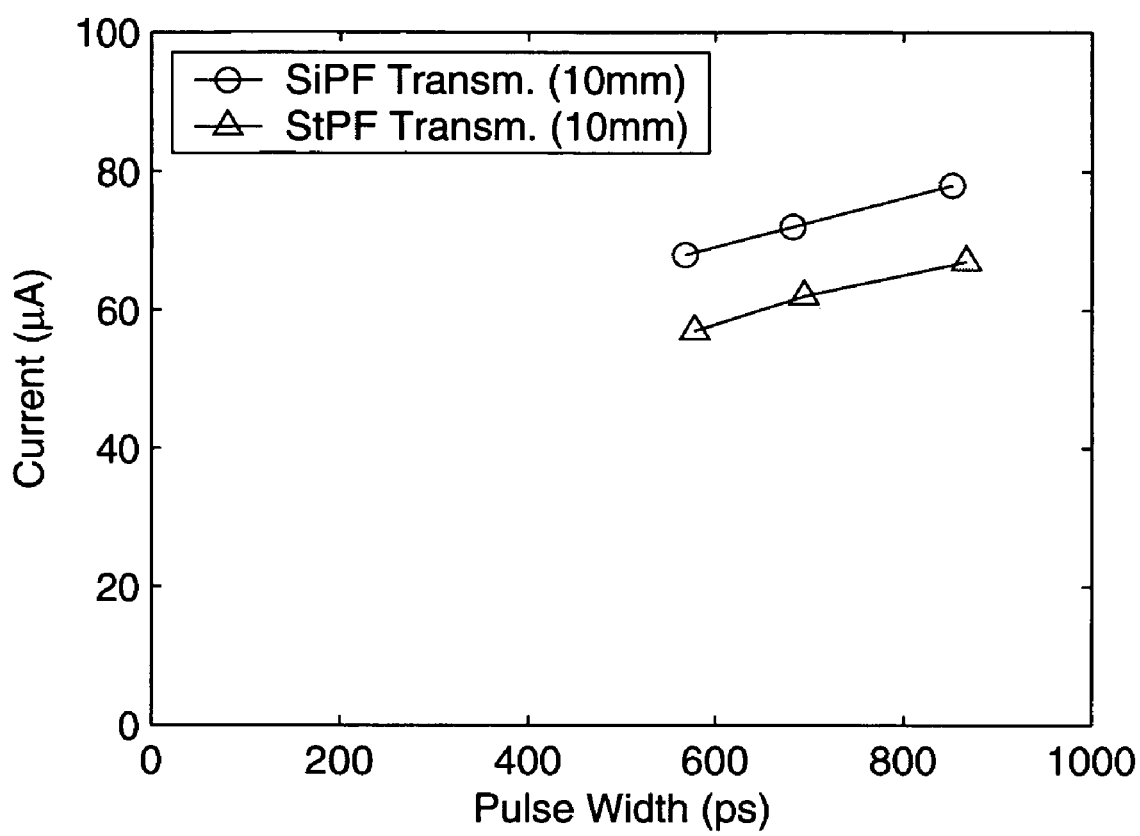
FIG. 15 shows the average current drawn as a function of current pulse width for exemplary systems according to the present invention.

To measure energy dissipation, an external 40 MHz clock signal with a small duty cycle was used so that current sources were enabled only during the transmission time. However, energy measurements for buffers with short interconnects (i.e., 1-2 mm) were limited to the bandwidth of the I/O buffer. For those cases, energy measurements were prorated to the ratio of the delay time and the minimum clock width that produced correct output. FIG. 14 shows the transmission system's energy-per-mm normalized to the energy-per-mm of the repeater-driven interconnect. The repeater-driven interconnect requires 3.39 pJ (i.e., 0.331 pJ/mm) per cycle (see Table II below). The 10 mm SiPF and StPF transmission circuits measured energy-per-mm dissipation per cycle is 61% and 51% of the inverter-repeater energy/mm, respectively. It is possible to use current pulses that are significantly shorter than the transceiver delay time, which would result in less energy dissipation. For the 10 mm SiPF and StPF transceivers, there would be a 20% energy reduction if ten is enabled for 250 ps instead of the 570 ps delay time. The energy reduction is not proportional to the pulse width because most of the current is drawn at the beginning of the pulse, immediately after the current sources are enabled, as shown in FIG. 7. This behavior, which is attributed to the capacitive load close to the transmission circuit, was also confirmed with hardware measurements where the average transceiver current over a 40 MHz clock cycle was measured for different current pulse widths, as illustrated in FIG. 15. Although the transceiver currents increase linearly with the pulse width, their slope indicates that the majority of the current is drawn at the beginning of the pulse.

TABLE II

Energy per cycle comparison between the 10 mm current-mode transceivers according to the present invention and the 10.228 mm repeater-based transceiver.

| Transceiver | Interconnect Length | Energy | Energy/mm | Energy/mm Ratio |
|---|---|---|---|---|
| Repeater | 10.228 mm | 3.39 pJ | 0.331 pJ/mm | 1.00 |
| SiPF | 10 mm | 2.04 pJ | 0.204 pJ/mm | 0.61 |
| StPF | 10 mm | 1.71 pJ | 0.171 pJ/mm | 0.51 |

Unlike repeater-driven interconnects, the energy dissipation of the transmission circuit is constant every cycle the bus is enabled, independent of switching activity. Thus, for small switching activity, repeater-driven interconnects are more energy-efficient than systems according to the present invention. Similarly, repeater-driven interconnects can be more energy-efficient than differential low-swing interconnects that must be reset after data transfers. It follows from our measurements that systems according to the present invention are more energy-efficient than repeater-driven interconnects for buses with switching activity higher than 50%, assuming the worst-case scenario in which the current sources of the transmission circuit are enabled for the duration of the transmission time. In the case that the current-mode driven bus is enabled on a cycle-by-cycle basis, there is no dissipation when the bus is disabled. Therefore, switching activity refers only to the cycles when the bus is enabled.

In addition to dynamic power, repeater-based global interconnects are also sources of static power leakage since they contain many inverters with relatively large transistors. For instance, the total width of all inverter transistors for the 10.228 mm repeater-based interconnect is approximately 400 μm for pFETs and 200 μm for nFETs. Using transmission and reception circuits according to the present invention reduces power leakage in global interconnects by an order of magnitude since the corresponding transistor width is approximately 10 times smaller for the similar size 10 mm transmission system according to the present invention.

HSPICE simulations were used to assess the effect of increasing the interconnect metal width. Increasing the interconnect width reduces the delay time for both the repeater-based and our current-mode interconnects because the resistance decreases at a faster rate than the capacitance increases. For instance, doubling the metal width from the minimum 0.3 μm to 0.6 μm causes its resistance to decrease by 50% while its capacitance increases by 20%. The repeater-based delay decreases by 15% and our 10 mm current-mode interconnect delay decreases by 20%. Our current-mode interconnects are more sensitive to resistance than capacitance changes compared to repeater-based interconnects, and hence, they benefit more from the interconnect resistance reduction. Doubling the metal width results in 7% energy dissipation increase for the repeater-based transceiver. The dynamic energy dissipation increase caused by the 20% capacitance increase is partially offset by a decrease in repeater short-circuit dissipation caused by the smaller switching time due to the interconnect RC reduction. The energy dissipation of our current-mode transceiver remains the same since the same amount of current is drawn for both single and double metal width.

For the 10 mm current-mode interconnects, HSPICE circuit simulations indicate that data can be transmitted at a rate of 1 Gb/sec per interconnect using 100 ps current pulses. For a given current amplitude, keeping the current pulses short not only results in low energy dissipation, but also in high bandwidth. Some of the charge injected into the interconnect wires during the data transfer ends up being stored in the interconnect capacitance after the current source is turned off The interconnect capacitance must be discharged before the next data can be transferred. The more charge left in the interconnect wires, the longer its reset time, and the lower its bandwidth.

Connecting multiple transmission circuits (FIG. 8A) to the same interconnect has two effects. First, the interconnect capacitance increases due to the drain capacitance of the transmission circuits. Second, the interconnect reset time can be reduced substantially since, as mentioned above, all the transmission circuits can contribute to discharging the interconnect wires after the data transfer completes. When the multiple transmission circuits are relatively sparse (e.g., one per mm), the interconnect total capacitance increases by approximately 10%. Such a multiple transmitter system according to the present invention can be optimized as follows. Since the delay of data transfer depends on the location of the transmission circuit in the interconnect (i.e., delay is approximately proportional to the distance between the transmission circuit and reception circuit), transmission circuits close to the reception circuit Rc1 can produce smaller currents relative to transmission circuits that are located far from the reception circuit Rc1. Therefore, the capacitance overhead of the transmission circuits can be minimized by sizing their current-source pFETs based on their physical distance from the reception circuit. This construction reduces both delay and energy dissipation. Also, shorter ten pulses can be used for transmission circuits closer to the reception circuit, but this would result only in power reduction. Using shorter ten pulses can be done alone or in combination with using smaller transmission currents for transmission circuits closer to the reception circuit.

To assess the N-to-1 connections, HSPICE simulations were performed using a 10 mm interconnect with ten (10) identical transmission circuits Tx placed every 1 mm. With approximately the same delay and power dissipation as a point-to-point connection, the 10-to-1 connection can achieve 40% higher bandwidth (i.e., 1.4 Gbs vs. 1 Gbs) since the reset time is reduced substantially when all ten transmission circuits are synchronized to simultaneously discharge the interconnect wires dwire and dwire*. Similarly the bandwidth of point-to-point interconnects can be increased using a distributed discharge mechanism. These discharge signals can be generated similar to ten and sen control signals as was discussed above.

Thus, delay- and energy-efficient differential current-sensed transmission systems according to the present invention suitable for semi-global and global on-chip signaling have been disclosed herein. Hardware measurements driving intermediate metal layers indicate the effectiveness of the present invention compared to using inverter repeater-based interconnects. In fact, current-mode transmission systems according to the present invention would be even more effective for driving interconnects running in higher metal layers with lower resistance per unit length than in the intermediate layer that was used in the above-constructed examples.

Two implementations of the transmission circuit were discussed in detail. In the SiPF implementation, current sources are controlled using logic gates and the interconnect that draws no current during data transfer is not actively clamped from the transmitter side. In the StPF implementation, current sources are controlled by enabling/disabling their path to the interconnects, and the interconnect that draws no current during data transfer is clamped from the transmitter side. Both implementations exhibited similar performance, especially for long interconnects.

As indicated above, the transmission systems according to the present invention can be used for N-to-I connections, which would reduce complexity in certain applications such as connections between the L2 cache and the processors in multiple-processor chips, and connections between SRAM macros in L2 caches.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A signal-transmission system comprising:
   a first interconnect wire having a first end and a second end;
   a second interconnect wire having a first end and a second end;
   a first transmission circuit having a data input to receive a data signal to be transmitted, an enable port to receive a transmission-control signal, a first output coupled to the first end of the first interconnect wire, and a second output coupled to the first end of the second interconnect wire, the data signal capable of having a first data value and a second data value, the transmission-control signal capable of having a transmission enable state and a transmission disable state;
   wherein the first transmission circuit comprises:
   a first transistor coupled between a first source of potential and the first end of the first interconnect wire, the first transistor being conductive when the transmission-control signal is in its disable state and non-conductive when the transmission-control signal is in its enable state;
   a second transistor coupled between the first source of potential and the first end of the second interconnect wire, the second transistor being conductive when the transmission-control signal is in its disable state and non-conductive when the transmission-control signal is in its enable state;
   a second potential;
   a first transistor stack coupled between the first and second potentials and to the first end of the first interconnect wire, the first transistor stack forming a conductive path between the first potential and the first end of the first interconnect wire when the transmission-control signal is in its enable state and the first data value is present at the data input, and further forming a conductive path between the second potential and the first end of the first interconnect wire when the transmission-control signal is in its enable state and the second data value is present at the data input; and
   a second transistor stack coupled between the first and second potentials and to the first end of the second interconnect wire, the second transistor stack forming a conductive path between the second potential and the first end of the second interconnect wire when the transmission-control signal is in its enable state and the first data value is present at the data input, and further forming a conductive path between the first potential and the first end of the second interconnect wire when the transmission-control signal is in its enable state and the second data value is present at the data input;
   in response to receiving the transmission enable state at its enable port and the first data value at its data input, the first transmission circuit coupling a first current having a first value at the first end of the first interconnect wire and coupling a second current having a second value at the first end of the second interconnect wire, the first and second currents having different values;
   in response to receiving the transmission enable state at its enable port and the second data value at its data input, the first transmission circuit coupling a third current having a third value at the first end of the first interconnect wire and coupling a fourth current having a fourth value at the first end of the second interconnect wire, the third and fourth currents having different values, the first and third currents having different values, and the second and fourth currents having different values;
   a reception circuit comprising a current-mode sense amplifier having a first input coupled to the second end of the first interconnect wire, a second input coupled to the second end of the second interconnect wire, and a data output to provide a signal representation of a binary value received at its inputs.

2. The system of claim 1 wherein the first transmission circuit generates a current difference at the first ends of the first and second interconnect wires when the transmission-control signal is in its enable state; and
   wherein, in response to receiving the transmission disable state at its enable port, the first transmission circuit reduces the magnitude of said current difference towards zero.

3. The system of claim 1 wherein, in response to receiving the transmission disable state at its enable port, the first transmission circuit couples the first ends of the first and second interconnect wires to a source of potential.

4. The system of claim 1 wherein the first transmission circuit causes the first and second interconnect wires to be substantially at the same potential just prior to receiving the transmission enable value at its enable port.

5. The system of claim 1 wherein the first current has an absolute value substantially greater than zero and the second current has a substantially zero value; and wherein the third current is substantially zero and the fourth current has an absolute value substantially greater than zero.

6. The system of claim 5 wherein the first transmission circuit couples the first end of the first interconnect wire to a predetermined potential when coupling the third current to the first interconnect wire, wherein the first transmission circuit couples the first end of the second interconnect wire to the predetermined potential when coupling the second current to the second interconnect wire.

7. The system of claim 5 wherein the first transmission circuit places the first end of the first interconnect wire in a floating state when coupling the third current to the first interconnect wire, wherein the first transmission circuit places the first end of the second interconnect wire in a floating state when coupling the second current to the second interconnect wire.

8. The system of claim 1 wherein the first and second interconnect wires are disposed on an integrated-circuit and run side-by-side with one another.

9. The system of claim 1 wherein the separation distance between the first ends of the first and second interconnect wires is less than the separation distance between the first and second ends of each interconnect wire, and wherein the separation distance between second ends of the first and second interconnect wires is less than the separation distance between the first and second ends of each interconnect wire.

10. The system of claim 1 wherein:
the reception circuit further comprises an enable port to receive a reception-control signal, the reception-control signal capable of having an enable state and a disable state;
the reception circuit places its current-mode sense amplifier in a reset state when the reception-control signal is in its disable state; and
the reception circuit places its current-mode sense amplifier in a sensing state capable of detecting a current difference at its first and second inputs when the reception-control signal is in its enable state.

11. The system of claim 10 wherein the current-mode sense amplifier does not draw power when in its reset state.

12. The system of claim 10 further comprising:
a first control circuit to generate the transmission-control signal to transition from the signal's disable state to the signal's enable state to start a data transfer, and to thereafter transition back to the signal's disable state to end the data transfer; and
a second control circuit to generate the reception-control signal to transition from the signal's disable state to the signal's enable state after the transmission-control signal has transitioned from its disable state to its enable state, and to thereafter transition back to the signal's disable state.

13. The system of claim 12 wherein the transmission-control signal transitions back to its disable state before the reception-control signal transitions back to its disable state.

14. The system of claim 12 wherein the transmission-control signal transitions back to its disable state concurrent with the reception-control signal transitioning to its enable state or beforehand.

15. The system of claim 12 wherein at least one of the first and second control circuits comprises a delay line.

16. The system of claim 1 wherein said transmission-control signal is a first transmission-control signal;
wherein the first interconnect wire has a first tap point disposed between its first and second ends;
wherein the second interconnect wire has a first tap point disposed between its first and second ends; and
wherein the system further comprises a second transmission circuit having a data input to receive a data signal to be transmitted, an enable port for receiving a second transmission-control signal, a first output coupled to the first tap point of the first interconnect wire, and a second output coupled to the first tap point of the second interconnect wire, the data signal capable of having a first data value and a second data value, the second transmission-control signal capable of having a transmission enable state and a transmission disable state;
wherein the second transmission circuit further has its respective set of first, second, third, and fourth currents;
wherein in response to receiving the transmission enable state at its enable port and the first data value at its data input, the second transmission circuit couples its first current having a first value at the first tap point of the first interconnect wire and couples its second current having a second value at the first tap point of the second interconnect wire, the first and second currents having different values; and
wherein in response to receiving the transmission enable state at its enable port and the second data value at its data input, the second transmission circuit couples its third current having a third value at the first tap point of the first interconnect wire and couples a fourth current having a fourth value at the first tap point of the second interconnect wire, the third and fourth currents having different values, the first and third currents having different values, and the second and fourth currents having different values.

17. The system of claim 16 where at least one of the first through fourth currents of the second transmission circuit has a magnitude that is less than the corresponding current of the first transmission circuit.

18. The system of claim 16 wherein the first transmission-control signal enters its transmission enable state for a first duration of time, wherein the second transmission-control signal enters its transmission enable state for a second duration of time, wherein the second duration is shorter than the first duration, and wherein the first and second durations do not overlap in time.

19. The system of claim 16 wherein the first transmission-control signal enters its transmission enable state for a first duration of time, wherein the second transmission-control signal enters its transmission enable state for a second duration of time, wherein the first and second durations are substantially equal, and wherein the first and second durations do not overlap in time.

20. The system of claim 16 wherein each of said first and second transmission circuits comprises a port to receive a discharge signal, the discharge signal having an enable state and a disable state, and wherein the first transmission circuit couples the first ends of the first and second interconnect wires to a source of potential when the discharge signal is in its enable state, and wherein the second transmission circuit couples the first tap points of the first and second interconnect wires to said source of potential when the discharge signal is in its enable state.

21. The system of claim 1 wherein each input of the current-mode sense amplifier is coupled to at least one conduction terminal of a transistor.

22. The system of claim 1 wherein the current-mode sense amplifier is adapted to sum the current from at least one interconnect wire with at least one current generated by the amplifier.

23. The system of claim 1 wherein the voltage at each input of the current-mode sense amplifier is substantially clamped to a given value.

24. The system of claim 1 wherein the input impedance of each input of the current-mode sense amplifier has a finite value at zero frequency.

25. A method of transmitting data across an integrated-circuit chip with a first interconnect wire and a second interconnect wire, each interconnect wire having a first end in a first area of the integrated-circuit chip, a second end in a second area of the integrated-circuit chip, and a first tap point that lies between the first and second ends in a third area of the integrated-circuit chip, the method comprising:

coupling at least one current at one of the first ends of the interconnect wires during a first period of time to generate a current difference in the interconnect wires that propagates from the first ends of the interconnect wires to the second ends of the interconnect wires, the current difference having a first sign to represent a first value of data transmitted and a second sign to represent a second value of data transmitted;

sensing the sign of the current difference at the second ends of the interconnect wires;

discharging the currents in the first and second interconnect wires in a second period of time that follows after the first period of time;

coupling at least one current at one of the first tap points of the interconnect wires during a third period of time to generate a current difference in the interconnect wires that propagates from the first tap points of the interconnect wires to the second ends of the interconnect wires, the third period of time occurring after the second period of time, the current difference having a first sign to represent a first value of data transmitted and a second sign to represent a second value of data transmitted;

sensing the sign of the current difference at the second ends of the interconnect wires; and discharging the currents in the first and second interconnect wires in a fourth period of time that follows after the third period of time.

* * * * *

UNITED STATES PATENT AND TRADEMARK OFFICE
CERTIFICATE OF CORRECTION

PATENT NO. : 7,405,593 B2
APPLICATION NO. : 11/265550
DATED : July 29, 2008
INVENTOR(S) : Nestor Tzartzanis et al.

It is certified that error appears in the above-identified patent and that said Letters Patent is hereby corrected as shown below:

Col. 3, Ln. 46: After "circuit" delete "Rd" and insert -- Rc1 --;

Col. 5, Ln. 8: After "point" delete "TO" and insert -- T0 --;

Col. 6, Ln. 14: After "reception circuit" delete "Rcd" and insert -- Rc1 --;

Col. 6, Ln. 15: After "and" delete "Rcd" and insert -- Rc1 --;

Col. 9, Ln. 5: After "state" delete "nIFETs" and insert -- nFETs --;

Col. 10, Ln. 14: After "circuit" delete "Rcd" and insert -- Rc1 --;

Col. 12, Ln. 16: After "from" delete "cikin" and insert -- clkin --.

Signed and Sealed this

Twenty-ninth Day of December, 2009

David J. Kappos
*Director of the United States Patent and Trademark Office*